United States Patent
Takashima et al.

(10) Patent No.: US 10,472,496 B2
(45) Date of Patent: Nov. 12, 2019

(54) FLAME-RETARDANT ADHESIVE COMPOSITION, COVERLAY FILM USING SAME, AND FLEXIBLE COPPER-CLAD LAMINATE

(71) Applicant: TOAGOSEI CO., LTD., Minato-ku (JP)

(72) Inventors: Masaru Takashima, Nagoya (JP); Yuya Okimura, Nagoya (JP); Masashi Yamada, Nagoya (JP)

(73) Assignee: TOAGOSEI CO., LTD., Minato-ku (JP)

( * ) Notice: Subject to any disclaimer, the term of this patent is extended or adjusted under 35 U.S.C. 154(b) by 572 days.

(21) Appl. No.: 15/022,630

(22) PCT Filed: Sep. 8, 2014

(86) PCT No.: PCT/JP2014/073655
§ 371 (c)(1),
(2) Date: Mar. 17, 2016

(87) PCT Pub. No.: WO2015/041085
PCT Pub. Date: Mar. 26, 2015

(65) Prior Publication Data
US 2016/0222192 A1    Aug. 4, 2016

(30) Foreign Application Priority Data

Sep. 20, 2013   (JP) .................. 2013-195898

(51) Int. Cl.
| | | |
|---|---|---|
| C08K 5/5357 | (2006.01) |
| C09J 109/06 | (2006.01) |
| B32B 15/08 | (2006.01) |
| B32B 15/20 | (2006.01) |
| B32B 27/28 | (2006.01) |
| B32B 27/34 | (2006.01) |
| H05K 3/28 | (2006.01) |
| C09J 153/00 | (2006.01) |
| H05K 1/02 | (2006.01) |
| H05K 3/46 | (2006.01) |
| C09J 109/02 | (2006.01) |
| C09J 7/22 | (2018.01) |
| C09J 7/30 | (2018.01) |
| C09J 7/25 | (2018.01) |
(Continued)

(52) U.S. Cl.
CPC ............ *C08K 5/5357* (2013.01); *B32B 15/08* (2013.01); *B32B 15/20* (2013.01); *B32B 27/281* (2013.01); *B32B 27/34* (2013.01); *C09J 7/22* (2018.01); *C09J 7/25* (2018.01); *C09J 7/30* (2018.01); *C09J 109/02* (2013.01); *C09J 109/06* (2013.01); *C09J 153/005* (2013.01); *H05K 1/02* (2013.01); *H05K 3/285* (2013.01); *H05K 3/4611* (2013.01); *B32B 2307/306* (2013.01); *B32B 2307/3065* (2013.01); *B32B 2405/00* (2013.01); *C08K 5/0066* (2013.01); *C08K 5/5317* (2013.01); *C09J 2203/326* (2013.01); *C09J 2205/102* (2013.01); *C09J 2453/00* (2013.01); *C09J 2477/006* (2013.01); *C09J 2479/086* (2013.01); *H05K 1/0326* (2013.01); *H05K 3/305* (2013.01); *H05K 3/386* (2013.01); *H05K 2201/012* (2013.01)

(58) Field of Classification Search
None
See application file for complete search history.

(56) References Cited

U.S. PATENT DOCUMENTS

| | | |
|---|---|---|
| 2,682,522 A | 6/1954 | Coover, Jr. et al. |
| 3,719,727 A | 3/1973 | Masai et al. |

(Continued)

FOREIGN PATENT DOCUMENTS

| | | |
|---|---|---|
| CN | 1865344 A | 11/2006 |
| CN | 102775442 A | 11/2012 |

(Continued)

OTHER PUBLICATIONS

Combined Chinese Office Action and Search Report dated Jan. 26, 2017 in Application No. 201480051447.X (with English language translation and English Translation of Categories of Cited Documents).

(Continued)

*Primary Examiner* — Coris Fung
(74) *Attorney, Agent, or Firm* — Oblon, McClelland, Maier & Neustadt, L.L.P.

(57) ABSTRACT

The flame-retardant adhesive composition contains a styrene-based elastomer containing a carboxyl group, an epoxy resin, and a phosphorus-containing oligomer including a structural unit represented by general formula (1), and the epoxy resin content is 1-20 parts by mass and the phosphorus-containing oligomer content is 10-50 parts by mass with respect to 100 parts by mass of the styrene-based elastomer containing carboxyl groups.

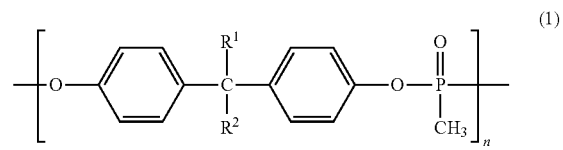

(wherein, $R^1$ and $R^2$ are each independently a hydrogen atom or a methyl group, n is an integer of 1-20.)

19 Claims, No Drawings

(51) Int. Cl.
    *C08K 5/00*     (2006.01)
    *C08K 5/5317*     (2006.01)
    *H05K 1/03*     (2006.01)
    *H05K 3/30*     (2006.01)
    *H05K 3/38*     (2006.01)

(56) References Cited

U.S. PATENT DOCUMENTS

| | | |
|---|---|---|
| 5,334,692 A | 8/1994 | Hess et al. |
| 2001/0004651 A1* | 6/2001 | Tomiyoshi ............... C08K 3/36 |
| | | 524/493 |
| 2008/0090075 A1* | 4/2008 | Kondo ...................... B32B 7/12 |
| | | 428/344 |
| 2012/0171460 A1* | 7/2012 | Freitag .................. C07F 9/4006 |
| | | 428/304.4 |
| 2017/0259544 A1* | 9/2017 | Okimura ................. B32B 15/08 |
| 2017/0342235 A1* | 11/2017 | Sakamoto ................ C08K 3/22 |

FOREIGN PATENT DOCUMENTS

| | | |
|---|---|---|
| JP | 4-298532 A | 10/1992 |
| JP | 2003-292927 A | 10/2003 |
| JP | 2005-248134 A | 9/2005 |
| JP | 2008-56820 A | 3/2008 |
| JP | 2009-96940 A | 5/2009 |
| JP | 2009-215494 A | 9/2009 |
| JP | 2013-170214 A | 9/2013 |

OTHER PUBLICATIONS

International Search Report dated Nov. 25, 2014 in PCT/JP2014/073655 filed Sep. 8, 2014.

* cited by examiner

FLAME-RETARDANT ADHESIVE COMPOSITION, COVERLAY FILM USING SAME, AND FLEXIBLE COPPER-CLAD LAMINATE

TECHNICAL FIELD

The present invention relates to a flame-retardant adhesive composition suitable for manufacturing related products including a flexible printed wiring circuit board (hereinafter, also referred to as "FPC"). The present invention also relates to a coverlay film, a flexible copper-clad laminated board and a bonding sheet that are obtained by using the flame-retardant adhesive composition.

BACKGROUND ART

Uses of the flexible printed wiring circuit board have been expanding since even in a limited space, steric high-density mounting is possible. In recent years, accompanied by miniaturization, weight saving, or the like, of the electronic devices, related products of the flexible printed wiring circuit board are diversified and demand of the related products are increasing. Such related products include a flexible copper-clad laminated board in which a copper foil is laminated to a polyimide film, a flexible printed wiring circuit board in which an electronic circuit is formed onto a flexible copper-clad laminated board, a flexible printed wiring circuit board attached with a reinforcing plate in which the flexible printed wiring circuit board and the reinforcing plate are laminated, a multilayered board in which flexible copper-clad laminated boards or flexible printed wiring circuit boards are laminated and bonded, and the like. When the flexible copper-clad laminated board is produced, an adhesive is generally used for adhering the polyimide film and the copper foil.

In addition, when the flexible printed wiring circuit board is produced, a film called "coverlay film" is generally used for protecting the wiring portion. The coverlay film has an insulating resin layer and an adhesive layer formed on the surface thereof. A polyimide resin composition has widely been used for forming the insulating resin layer. And the flexible printed wiring circuit board is produced by laminating the coverlay film to a surface having a wiring portion through the adhesive layer by utilizing hot press, or the like. At this time, the adhesive layer of the coverlay film is required to have firm adhesiveness to both of the wiring portion and the film base layer.

As the printed wiring board, it has been known a build-up type multilayer printed wiring board in which a conductive layer and an organic insulating layer are alternately laminated on the surface of a substrate. When such a multilayer printed wiring board is produced, the so-called "bonding sheet", which is an insulating adhesive layer forming material, is used for bonding the conductive layer and the organic insulating layer. The insulating adhesive layer is required to have embedding property to the wiring portion and firm adhesiveness to both of the constitutional materials at the conductive portion forming the circuit (copper, etc.) and the organic insulating layer (a polyimide resin, etc.).

On the other hand, high flame retardancy is required for an adhesive to be used for producing the flexible printed wiring circuit board, and the like. In particular, flame retardancy of VTM-0 class is required in UL-94 standard. To satisfy such a high flame retardancy, a flame retardant such as a halogen-based compound, and an antimony compound has heretofore been formulated in the adhesive composition.

In recent years, there has been growing an interest in environmental problems, the halogen-based compound becomes a factor which generates a harmful substance such as dioxin at the time of burning and the like after disposal, and the antimony compound is also pointed out its carcinogenicity, so that a flame-retardant adhesive not using these compounds is required.

Under these circumstances, the following technology has been known, either of which realizes adhesion to an adherend or adhesion of two parts by forming a cured product by the reaction of the contained components to each other. Patent Document 1 discloses a flame-retardant adhesive composition containing a non-halogen-based epoxy resin, a thermoplastic resin and/or a synthetic rubber, a curing agent, a curing accelerator, a phosphorus-containing plasticizer and an inorganic filler. Patent Document 2 discloses a halogen-free flame-retardant adhesive composition containing a thermoplastic resin such as a polyamide resin, a novolac type epoxy resin, a phosphor compound and melamine cyanurate. Further, Patent Document 3 discloses a flame-retardant adhesive composition containing a polyurethane polyurea resin, an epoxy resin containing no halogen element, a cyclophosphazene-based flame retardant and a flame retardant comprising a nitrogen-based compound having a melamine chemical structure.

PRIOR TECHNICAL LITERATURE

Patent Literature

[Patent Document 1] JP-A 2005-248134
[Patent Document 2] JP-A 2008-56820
[Patent Document 3] JP-A 2009-96940

SUMMARY OF THE INVENTION

Problems that the Invention is to Solve

If the inorganic flame retardant described in Patent Document 1 is used, a content of the inorganic flame retardant is increased, so that a problem that flexibility and adhesiveness required for the uses of the flexible printed wiring circuit board become declined. If the phosphor compounds described in Patent Documents 1 and 2 are used, the phosphor compound is decomposed under the environmental conditions of high temperature and high humidity, so that there is a problem that insulation reliability of the adherend is significantly reduced. Here, insulation reliability means a property which is evaluated by applying a voltage to a test piece under high temperature and high humidity, and observing an appearance of an electrode, or measuring an insulation resistance value between the electrodes.

Further, if the phosphazene-based flame retardant described in Patent Document 3 is used, there is a problem that the flame retardant becomes successively bled out from the cured product of the adhesive, whereby it contaminates the electrode and the other parts.

An object of the present invention is to provide a flame-retardant adhesive composition having flame retardancy required for the uses of the flexible printed wiring circuit board, and exhibiting excellent adhesiveness, heat resistance and insulation reliability.

Means to Solve the Problems

The present inventors found that an adhesive composition containing a carboxyl group-containing styrene-based elastomer, an epoxy resin and a phosphorus-containing oligomer having a specific structural unit leads to flame retardancy, and exhibits excellent adhesiveness, heat resistance and insulation reliability to complete the invention.

In the present specification, the "adhesive layer" means a layer having a property which is capable of adhering to an adherend or adhering at least two parts consisting of the same materials or the different materials at a stage at which at least a part begins to cure at the portion of a film or the like containing a carboxyl group-containing styrene-based elastomer (A), an epoxy resin (B) and a phosphorus-containing oligomer (C) having a specific structural unit. In addition, the "adhered portion" means a cured portion comprising a cured product formed after adhesion, and the "cured product" means not only completely cured but also contains the state in which it includes a crosslinking structure at least a part thereof such as semi-cured.

In the present specification, a weight average molecular weight (hereinafter, also referred to as "Mw") is a conversion value of standard polystyrene measured by gel permeation chromatography (hereinafter, also referred to as "GPC").

The present invention is as follows.

1. A flame-retardant adhesive composition comprising (A) a carboxyl group-containing styrene-based elastomer, (B) an epoxy resin, and (C) a phosphorus-containing oligomer having a structural unit represented by a general formula (1), wherein a content of the epoxy resin (B) is in a range from 1 to 20 parts by mass, and a content of the phosphorus-containing oligomer (C) is in a range from 10 to 50 parts by mass based on 100 parts by mass of a content of the carboxyl group-containing styrene-based elastomer (A).

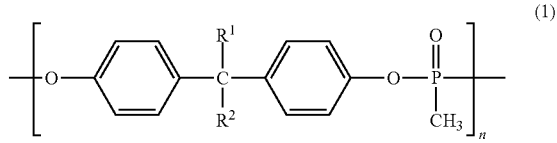

(wherein, $R^1$ and $R^2$ are each independently a hydrogen atom or a methyl group, n is an integer of 1 to 20.)

2. The flame-retardant adhesive composition according to 1 above, wherein an acid value of the carboxyl group-containing styrene-based elastomer (A) is in a range from 0.1 to 20 mgKOH/g.

3. The flame-retardant adhesive composition according to 1 or 2 above, wherein a main chain chemical structure of the carboxyl group-containing styrene-based elastomer (A) is derived from at least one styrene-based elastomer selected from a group consisting of a styrene-butadiene block copolymer, a styrene-ethylene propylene block copolymer, a styrene-butadiene-styrene block copolymer, a styrene-isoprene-styrene block copolymer, a styrene-ethylene butylene-styrene block copolymer, and a styrene-ethylene propylene-styrene block copolymer.

4. The flame-retardant adhesive composition according to any one of 1 to 3 above, wherein a weight-average molecular weight of the phosphorus-containing oligomer (C) is in a range from 1000 to 10000.

5. The flame-retardant adhesive composition according to any one of 1 to 4 above, wherein a phosphor concentration in the flame-retardant adhesive composition is in a range from 0.7% to 3% by mass based on 100% by mass of a solid content of the flame-retardant adhesive composition.

6. A coverlay film comprising an adhesive layer obtained by using the flame-retardant adhesive composition according to any one of 1 to 5 above, wherein the adhesive layer is formed onto one surface of a polyimide film or an aramid film.

7. A flexible copper-clad laminated board wherein a copper foil is laminated onto one surface of a polyimide film or an aramid film using the flame-retardant adhesive composition according to any one of 1 to 5 above.

8. A bonding sheet comprising an adhesive layer obtained by using the flame-retardant adhesive composition according to any one of 1 to 5 above, wherein the adhesive layer is formed onto one surface of a releasable film.

Effect of the Invention

The flame-retardant adhesive composition of the present invention has high adhesiveness to a flexible film such as a polyimide film, and can form an adhered portion excellent in flame retardancy, heat resistance and insulation reliability. In addition, a resin flowing-out property after adhering two parts under heating is good. Accordingly, the flame-retardant adhesive composition of the present invention is suitable for manufacturing related products of FPC such as a coverlay film, a flexible copper-clad laminated board and a bonding sheet.

EMBODIMENTS FOR CARRYING OUT THE INVENTION

In the following, the flame-retardant adhesive composition of the present invention, and a coverlay film and a flexible copper-clad laminated board using the same will be explained in detail.

1. Flame-retardant Adhesive Composition

The flame-retardant adhesive composition of the present invention is an adhesive composition containing (A) a carboxyl group-containing styrene-based elastomer, (B) an epoxy resin and (C) a phosphorus-containing oligomer having a structural unit represented by the general formula (1) with a predetermined ratio. In the flame-retardant adhesive composition of the present invention, a carboxyl group in the carboxyl group-containing styrene-based elastomer (A) and an epoxy group in the epoxy resin (B) are reacted to exhibit adhesiveness, and started to form a cured product whereby high adhesiveness to an adherend can be obtained. The adhered portion is also excellent in heat resistance and insulation reliability.

Hereinafter, components contained in the flame-retardant adhesive composition of the present invention are specifically described.

(A) Carboxyl Group-containing Styrene-based Elastomer

The carboxyl group-containing styrene-based elastomer (A) is one of the main components of the flame-retardant adhesive composition in the present invention, and is a component which gives adhesiveness and flexibility. The main chain chemical structure of the carboxyl group-containing styrene-based elastomer is derived from a copolymer or a hydrogenated product thereof that include mainly a block or random structures of a conjugated diene compound and an aromatic vinyl compound. Examples of the aromatic compound include styrene, t-butyl styrene, α-methyl styrene, p-methyl styrene, divinyl benzene, 1,1-diphenyl styrene, N,N-diethyl-p-aminoethyl styrene, vinyl toluene, p-tert-butyl styrene, and the like. Examples of the conjugated diene compound include butadiene, isoprene, 1,3-pentadiene, 2,3-dimethyl-1,3-butadiene, and the like.

The main chain chemical structure of the carboxyl group-containing styrene-based elastomer (A) may be derived from a styrene-butadiene block copolymer, a styrene-ethylene propylene block copolymer, a styrene-butadiene-styrene block copolymer, a styrene-isoprene-styrene block copolymer, a styrene-ethylene butylene-styrene block copolymer, a styrene-ethylene propylene-styrene block copolymer, or the like. Among these, a styrene-ethylene butylene-styrene block copolymer and a styrene-ethylene propylene-styrene block copolymer are preferable from a viewpoint of adhesiveness. A mass ratio of the styrene/ethylene butylene in the styrene-ethylene butylene-styrene block copolymer is preferably 10/90 to 50/50, and a mass ratio of the styrene/ethylene propylene in the styrene-ethylene propylene-styrene block copolymer is preferably 10/90 to 50/50. When the mass ratio is within the above range, a flame-retardant adhesive composition which exhibits excellent adhesiveness can be prepared.

The carboxyl group-containing styrene-based elastomer (A) may be a material which is obtained by copolymerizing an unsaturated carboxylic acid at a time of polymerization of a styrene-based elastomer. In addition, it may be a material which is obtained by heating and kneading a styrene-based elastomer and an unsaturated carboxylic acid in a presence of an organic peroxide. Examples of the unsaturated carboxylic acid include acrylic acid, methacrylic acid, maleic acid, itaconic acid, fumaric acid, maleic anhydride, itaconic anhydride, fumaric anhydride, and the like. A modified amount by the unsaturated carboxylic acid is generally in a range from 0.1% to 10% by mass based on an amount of the carboxyl group-containing styrene-based elastomer (A).

An acid value of the carboxyl group-containing styrene-based elastomer (A) is preferably in a range from 0.1 to 20 mg KOH/g, more preferably from 0.5 to 18 mg KOH/g, and further preferably from 1.0 to 15 mg KOH/g. When the acid value is in the range from 0.1 to 20 mg KOH/g, the flame-retardant adhesive composition is sufficiently cured and leads to good adhesiveness and heat resistance.

Mw of the carboxyl group-containing styrene-based elastomer (A) is preferably in a range from 10,000 to 500,000, more preferably from 30,000 to 300,000, and further preferably from 50,000 to 200,000. When the Mw is within the range of 10,000 to 500,000, flexibility required for the FPC related products and excellent adhesiveness can be exhibited.

(B) Epoxy Resin

The epoxy resin (B) used in the present invention reacts with the carboxyl group-containing styrene-based elastomer (A) to exhibit adhesiveness and heat resistance.

A type of the epoxy resin (B) is not particularly limited. Examples of the epoxy resin include a bisphenol A type epoxy resin or a hydrogenated product thereof, a bisphenol F type epoxy resin or a hydrogenated product thereof; a glycidyl ester-based epoxy resin such as orthophthalic acid diglycidyl ester, isophthalic acid diglycidyl ester, terephthalic acid diglycidyl ester, p-hydroxybenzoic acid glycidyl ester, tetrahydrophthalic acid diglycidyl ester, succinic acid diglycidyl ester, adipic acid diglycidyl ester, sebacic acid diglycidyl ester, and trimellitic acid triglycidyl ester; a glycidyl ether-based epoxy resin such as ethylene glycol diglycidyl ether, propylene glycol diglycidyl ether, 1,4-butanediol diglycidyl ether, 1,6-hexanediol diglycidyl ether, trimethylolpropane triglycidyl ether, pentaerythritol tetraglycidyl ether, tetraphenylglycidyl ether ethane, triphenylglycidyl ether ethane, a polyglycidyl ether of sorbitol, and a polyglycidyl ether of polyglycerol; a glycidylamine-based epoxy resin such as triglycidyl isocyanurate, and tetraglycidyl diaminodienylmethane; a linear aliphatic epoxy resin such as an epoxidized polybutadiene, and an epoxidized soybean oil; a novolac type epoxy resin such as a phenol novolac epoxy resin, an o-cresol novolac epoxy resin, and a bisphenol A novolac epoxy resin; a brominated bisphenol A type epoxy resin, a phosphorus-containing epoxy resin, a dicyclopentadiene chemical structure-containing epoxy resin, a naphthalene chemical structure-containing epoxy resin, an anthracene type epoxy resin, a tertiary butylcatechol type epoxy resin, a triphenylmethane type epoxy resin, a tetraphenylethane type epoxy resin, a biphenyl type epoxy resin, a bisphenol S type epoxy resin, and the like. These epoxy resins may be used singly or in combination of two or more types thereof.

When a resin having two or more epoxy groups in one molecule is used as the epoxy resin (B) in the present invention, it forms a crosslinked structure by a reaction with the carboxyl group-containing styrene-based elastomer (A) to exhibit high heat resistance. Such a polyfunctional epoxy resin is preferably a bisphenol A type epoxy resin, a dicyclopentadiene chemical structure-containing epoxy resin, a naphthalene chemical structure-containing epoxy resin, or the like. Incidentally, if an epoxy resin having one epoxy group is used, the degree of crosslinking with the carboxyl group-containing styrene-based elastomer (A) is low, and sufficient heat resistance may not be obtained.

A content of the epoxy resin (B) in the flame-retardant adhesive composition of the present invention is in a range from 1 to 20 parts by mass, and preferably from 3 to 17 parts by mass based on 100 parts by mass of the carboxyl group-containing styrene-based elastomer (A). If the content is less than 1 part by mass, sufficient heat resistance cannot be obtained. On the other hand, if the content exceeds 20 parts by mass, adhesiveness or insulation reliability is lowered in some cases.

(C) Phosphor-containing Oligomer

The phosphorus-containing oligomer (C) to be used in the present invention is an oligomer having a structural unit represented by the following general formula (1), and is a component to provide flame retardancy to the adhesive composition. The phosphorus-containing oligomer (C) has higher molecular weight as compared with a phosphoric acid ester or phosphazene which has heretofore been used as the flame retardant, so that it is extremely less bled out from the adhesive cured product with a lapse of time. Accordingly, no contamination of an electrode and the like in the FPC related products occurs.

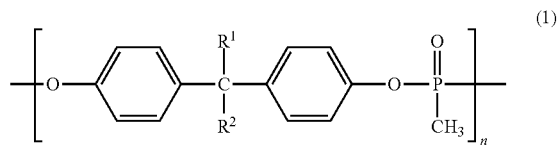

In the general formula (1), $R^1$ and $R^2$ each independently represent a hydrogen atom or a methyl group. n is an integer of 1 to 20, and preferably an integer of 1 to 17.

In the compound represented by the general formula (1), a terminal may be a hydroxyl group, or the like.

Examples of the phosphorus-containing oligomer (C) include a phosphorus-containing oligomer represented by the following general formula (2).

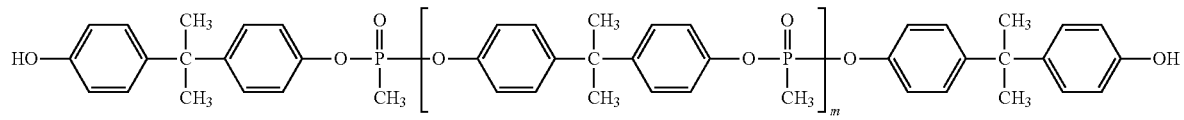

(2)

(Wherein, m is an integer of 0 to 16.)

Mw of the phosphorus-containing oligomer (C) is preferably in a range from 1,000 to 10,000, more preferably from 1,200 to 8,000, and further preferably from 1,500 to 5,000. When Mw is in the range from 1,000 to 10,000, excellent flame retardancy can be obtained. In addition, when a solvent is used, it can be made a composition in which the compound is dissolved with the carboxyl group-containing styrene-based elastomer (A) and the epoxy resin (B).

A content of the phosphorus-containing oligomer (C) in the flame-retardant adhesive composition is required to be in a range from 10 to 50 parts by mass based on 100 parts by mass of the carboxyl group-containing styrene-based elastomer (A) from viewpoints of flame retardancy and adhesiveness. The content is preferably from 10 to 40 parts by mass. If the content is less than 10 parts by mass, flame retardancy may be insufficient. On the other hand, if the content exceeds 50 parts by mass, compatibility with the other components constituting the adhesive composition becomes worse and the components may be separated.

The flame-retardant adhesive composition of the present invention may contain, in addition to the carboxyl group-containing styrene-based elastomer (A), the epoxy resin (B) and the phosphorus-containing oligomer (C), the other thermoplastic resins except the carboxyl group-containing styrene-based elastomer (A), a tackifier, the other flame retardants except the phosphorus-containing oligomer (C), a curing agent, a curing accelerator, a coupling agent, a thermal aging preventive agent, a leveling agent, a defoaming agent, an inorganic filler, a solvent, and the like to an extent that functions of the flame-retardant adhesive composition are unaffected.

Examples of the other thermoplastic resin include a phenoxy resin, a polyamide resin, a polyester resin, a polycarbonated resin, a polyphenyleneoxide resin, a polyurethane resin, a polyacetal resin, a polyethylene-based resin, a polypropylene-based resin, a polyvinyl-based resin, and the like. These thermoplastic resins may be used singly or in combination of two or more types thereof.

Examples of the tackifier include a coumarone indene resin, a terpene resin, a terpene phenol resin, a rosin resin, a p-t-butylphenol acetylene resin, a phenol formaldehyde resin, a xylene formaldehyde resin, a petroleum-based hydrocarbon resin, a hydrogenated hydrocarbon resin, a turpentine-based resin, and the like. These tackifiers may be used singly or in combination of two or more types thereof.

The other flame retardants may be either of an organic flame retardant or an inorganic flame retardant. Examples of the organic flame retardant include a phosphor-based flame retardant such as melamine phosphate, melamine polyphosphate, guanidine phosphate, guanidine polyphosphate, ammonium phosphate, ammonium polyphosphate, ammonium phosphate amide, ammonium polyphosphate amide, carbamate phosphate, carbamate polyphosphate, aluminum trisdiethyl phosphinate, aluminum trismethylethyl phosphinate, aluminum trisdiphenyl phosphinate, zinc bisdiethyl phosphinate, zinc bismethylethyl phosphinate, zinc bisdiphenyl phosphinate, titanyl bisdiethyl phosphinate, titanium tetrakisdiethyl phosphinate, titanyl bismethylethyl phosphinate, titanium tetrakismethylethyl phosphinate, titanyl bisdiphenyl phosphinate, and titanium tetrakisdiphenyl phosphinate; a nitrogen-based flame retardant such as a triazine-based compound including melamine, melam, melamine cyanurate and the like, a cyanuric acid compound, an isocyanuric acid compound, a triazole-based compound, a tetrazole compound, a diazo compound, and urea; a silicon-based flame retardant such as a silicone compound and a silane compound; and the like. In addition, examples of the inorganic flame retardant include a metal hydroxide such as aluminum hydroxide, magnesium hydroxide, zirconium hydroxide, barium hydroxide, and calcium hydroxide; a metal oxide such as tin oxide, aluminum oxide, magnesium oxide, zirconium oxide, zinc oxide, molybdenum oxide, and nickel oxide; zinc carbonate, magnesium carbonate, calcium carbonate, barium carbonate, zinc borate, hydrated glass, and the like. These flame retardants may be used singly or in combination of two or more types thereof.

The curing agent is a component for forming a crosslinking structure by a reaction with the epoxy resin (B). Examples of the curing agent include an amine-based curing agent such as an aliphatic diamine, an aliphatic polyamine, a cyclic aliphatic diamine and an aromatic diamine; a polyamide amine-based curing agent; an acid-based curing agent such as an aliphatic polycarboxylic acid, an alicyclic polycarboxylic acid, an aromatic polycarboxylic acid and acid anhydrides thereof; a basic active hydrogen-based curing agent such as dicyandiamide and an organic acid dihydrazide; a polymercaptane-based curing agent; a novolac resin-based curing agent; a urea resin-based curing agent; a melamine resin-based curing agent; and the like. These curing agents may be used singly or in combination of two or more types thereof.

Examples of the aliphatic diamine-based curing agent include ethylene diamine, 1,3-diaminopropane, 1,4-diaminobutane, hexamethylenediamine, polymethylenediamine, polyether diamine, 2,5-dimethylhexamethylenediamine, trimethylhexamethylenediamine, and the like.

Examples of the aliphatic polyamine-based curing agent include diethylene triamine, iminobis(hexamethylene) triamine, trihexatetramine, tetraethylene pentamine, aminoethylethanolamine, tri(methylamino)hexane, dimethylaminopropylamine, diethylaminopropylamine, methyliminobispropylamine, and the like.

Examples of the cyclic aliphatic diamine-based curing agent include menthenediamine, isophorone diamine, bis(4-amino-3-methyldicyclohexyl)methane, diaminodicyclohexylmethane, bis(aminomethyl)cyclohexane, N-ethylaminopiperazine, 3,9-bis(3-aminopropyl) 2,4,8,10-tetraoxaspiro-(5,5)undecane, a hydrogenated product of meta-xylylene diamine, and the like.

Examples of the aromatic diamine-based curing agent include meta-phenylene diamine, diaminodiphenylmethane, diaminodiphenylsulfone, diaminodiethyldiphenylmethane, meta-xylylene diamine, and the like.

Examples of the aliphatic polycarboxylic acid-based curing agent and the acid anhydride-based curing agent include succinic acid, adipic acid, dodecenyl succinic anhydride, polyadipic anhydride, polyazelaic polyanhydride, polysebacic anhydride, and the like.

Examples of the alicyclic polycarboxylic acid-based curing agent and the acid anhydride-based curing agent include methyltetrahydrophthalic acid, methylhexahydrophthalic acid, methylhimic acid, hexahydrophthalic acid, tetrahydrophthalic acid, trialkyltetrahydrophthalic acid, methylcyclodicarboxylic acid, and acid anhydrides thereof, and the like.

Examples of the aromatic polycarboxylic acid-based curing agent and acid anhydride-based curing agent include phthalic acid, trimellitic acid, pyromellitic acid, benzophenone tetracarboxylic acid, ethylene glycol glycol bistrimellitic acid, glycerol tristrimellitic acid, and acid anhydrides thereof, and the like.

Examples of the polymercaptane-based curing agent include a mercaptized epoxy resin, a mercaptopropionic acid ester, and the like.

Examples of the novolac-based curing agent include a phenol novolac-based curing agent, a cresol novolac-based curing agent, and the like.

When the flame-retardant adhesive composition of the present invention contains a curing agent, a content of the curing agent is preferably set so that a functional group equivalent is in a range from 0.2 to 2.5, and more preferably from 0.4 to 2.0 based on 1 epoxy equivalent of the epoxy resin (B). If the functional group equivalent of the curing agent is in the range of 0.2 to 2.5, the adhesive forms a sufficiently cured state, and good adhesiveness and heat resistance can be obtained.

The curing accelerator is a component for promoting a reaction between the carboxyl group-containing styrene-based elastomer (A) and epoxy resin (B). Examples of the curing accelerator include a tertiary amine-based curing accelerator, a tertiary amine salt-based curing accelerator, an imidazole-based curing accelerator, and the like.

Examples of the tertiary amine-based curing accelerator include benzyldimethylamine, 2-(dimethylaminomethyl) phenol, 2,4,6-tris(dimethylaminomethyl)phenol, tetramethylguanidine, triethanolamine, N,N'-dimethylpiperazine, triethylene diamine, 1,8-diazabicyclo[5.4.0]undecene, and the like.

Examples of the tertiary amine salt-based curing accelerator include a formic acid salt, an octyl acid salt, a p-toluenesulfonic acid salt, an o-phthalic acid salt, a phenol salt or a phenol novolac resin salt of 1,8-diaza-bicyclo[5.4.0]undecene; a formic acid salt, an octyl acid salt, a p-toluenesulfonic acid salt, an o-phthalic acid salt, a phenol salt or a phenol novolac resin salt of 1,5-diazabicyclo[4.3.0]nonene; and the like.

Examples of the imidazole-based curing accelerator include 2-methyl imidazole, 2-undecyl imidazole, 2-heptadecyl imidazole, 1,2-dimethyl imidazole, 2-methyl-4-ethyl imidazole, 2-phenyl imidazole, 2-phenyl-4-methyl imidazole, 1-benzyl-2-methyl imidazole, 1-benzyl-2-phenyl imidazole, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adduct, 2-phenyl imidazole isocyanuric acid adduct, 2-phenyl-4,5-dihydroxymethyl imidazole, 2-phenyl-4-methyl-5-hydroxymethyl imidazole, and the like.

When the flame-retardant adhesive composition of the present invention contains a curing accelerator, a content thereof is preferably in a range from 1 to 10 parts by mass, and particularly from 2 to 5 parts by mass based on 100 parts by mass of the epoxy resin (B). When the content of the curing accelerator is in the range of 1 to 10 parts by mass, the composition is excellent in adhesiveness and heat resistance.

Examples of the coupling agent include a silane-based coupling agent such as vinyltrimethoxysilane, 3-glycidoxypropyltrimethoxysilane, p-styryltrimethoxysilane, 3-methacryloxypropylmethyldimethoxysilane, 3-acryloxypropyltrimethoxysilane, N-2-(aminoethyl)-3-aminopropylmethyldimethoxysilane, 3-ureidopropyltriethoxysilane, 3-mercaptopropylmethyldimethoxysilane, bis(triethoxysilylpropyl)tetrasulfide, 3-isocyanatepropyltriethoxysilane and imidazole silane; a titanate-based coupling agent; an aluminate-based coupling agent; a zirconium-based coupling agent, and the like. These compounds may be used singly or in combination of two or more types thereof.

Examples of the thermal aging preventive agent include a phenol-based antioxidant such as 2,6-di-tert-butyl-4-methylphenol, n-octadecyl-3-(3',5'-di-tert-butyl-4'-hydroxyphenyl)propionate, and tetrakis[methylene-3-(3,5-di-tert-butyl-4-hydroxyphenyl)propionate]methane; a sulfur-based antioxidant such as dilauryl-3,3'-thiodipropionate, and dimyristyl-3,3'-dithiopropionate; a phosphor-based antioxidant such as trisnonylphenylphosphite, and tris(2,4-di-tert-butylphenyl)phosphite; and the like. These compounds may be used singly or in combination of two or more types thereof.

Examples of the inorganic filler include a powder comprising calcium carbonate, titanium oxide, aluminum oxide, zinc oxide, carbon black, talc, silica, copper, silver, or the like. These compounds may be used singly or in combination of two or more types thereof.

A phosphorus concentration in the flame-retardant adhesive composition is preferably in a range from 0.7% to 3% by mass, and more preferably from 1% to 2% by mass based on a solid content of the composition, i.e., when a total of the carboxyl group-containing styrene-based elastomer (A), epoxy resin (B), phosphorus-containing oligomer (C), and, the other components except the solvent is made 100% by mass. When the phosphorus concentration is in the range from 0.7% to 3% by mass, sufficient flame retardancy can be provided, and the effect provided to adhesiveness or insulation reliability is a little. The phosphorus concentration in the flame-retardant adhesive composition can be obtained by the conventionally known elemental analysis device, or the like. When the components of the raw materials have been already known, it can be obtained by summing the phosphorus concentrations of the phosphorus-containing oligomer (C) and the other components.

The flame-retardant adhesive composition of the present invention can be produced by mixing the carboxyl group-containing styrene-based elastomer (A), epoxy resin (B), phosphorus-containing oligomer (C) and the other components. The flame-retardant adhesive composition of the present invention is preferably used in a state of a solution or a dispersion, so that a solvent is generally used. Examples of the solvent include an alcohol such as methanol, ethanol, isopropyl alcohol, n-propyl alcohol, isobutyl alcohol, n-butyl alcohol, benzyl alcohol, ethylene glycol monomethyl ether, propylene glycol monomethyl ether, diethylene glycol monomethyl ether, and diacetone alcohol; a ketone such as acetone, methyl ethyl ketone, methyl isobutyl ketone, methyl amyl ketone, cyclohexanone, and isophorone; an aromatic hydrocarbon such as toluene, xylene, ethylbenzene, and mesitylene; an ester such as methyl acetate, ethyl acetate, ethylene glycol monomethyl ether acetate, and 3-methoxybutyl acetate; an aliphatic hydrocarbon such as hexane, heptane, cyclohexane, and methylcyclohexane; and the like. These solvents may be used singly or in combination of two or more types thereof. When the flame-retardant adhesive composition of the present invention is a solution or a dispersion containing a solvent, coating to an adherend and formation of an adhesive layer can be carried out smoothly, and an adhesive layer having a desired thickness can be easily obtained.

When the flame-retardant adhesive composition of the present invention contains a solvent, the solvent is used so that the solid concentration becomes preferably in a range from 3% to 80% by mass, and more preferably from 10% to 50% by mass from viewpoints of workability including a film formability. If the solid concentration exceeds 80% by mass, a viscosity of the solution becomes too high, and it may be difficultly coated uniformly.

A suitable adherend according to the flame-retardant adhesive composition of the present invention is a material containing a polymer material such as a polyimide resin, a polyether ether ketone resin, a polyphenylene sulfide resin, an aramid resin, and a liquid crystal polymer; an inorganic material such as copper, aluminum, and stainless; and the like. A shape of the adherend is not particularly limited. Two parts consisting of the same material or different materials as the adherends are adhered with the flame-retardant adhesive composition of the present invention to each other to produce an integrated composite material. Additionally, a product having an adhesive layer which has adhesiveness such as the following coverlay film and a bonding sheet can be produced.

2. Coverlay Film

The coverlay film of the present invention is characterized in that an adhesive layer obtained using the flame-retardant adhesive composition of present invention is formed on one of a surfaces of a polyimide film or an aramid film. Since the flame-retardant adhesive composition of the present invention is, in particular, excellent in adhesiveness with a polyimide resin and an aramid resin, the coverlay film of the present invention is a film in which the adhesive layer and the polyimide film or aramid film are difficultly peeled off.

The polyimide film and aramid film are not particularly limited so long as they have electrical insulation. They may be each a film consisting of a polyimide resin or an aramid resin, a film containing the resin and an additive(s), or the like. A surface treatment may be applied at a side at which the adhesive layer is formed.

A thickness of the polyimide film or aramid film is generally in a range from 3 to 125 µm. A thickness of the adhesive layer is generally in a range from 5 to 50 µm, and preferably from 10 to 40 µm.

A method for producing the coverlay film of the present invention may be mentioned a method in which a flame-retardant adhesive composition including a carboxyl group-containing styrene-based elastomer (A), an epoxy resin (B), a phosphorus-containing oligomer (C) and a solvent is coated on a surface of, for example, a polyimide film, and heating and drying are conducted for 2 to 10 minutes to remove the solvent. A heating temperature for drying is preferably in a range from 40° C. to 250° C., and more preferably from 70° C. to 170° C. The drying is generally carried out by passing the film attached with a coated film through a furnace in which hot air drying, far infrared radiation heating, high frequency induction heating, or the like is carried out. A releasable film may be laminated onto a surface of the adhesive layer for storage, if necessary. The releasable film may be used a conventionally known material such as a polyethylene terephthalate film, a polyethylene film, a polypropylene film, a silicone releasable treatment paper, a polyolefin resin-coated paper, a TPX film, and a fluorine-based resin film.

3. Flexible Copper-clad Laminated Board

The flexible copper-clad laminated board of the present invention is characterized in that a polyimide film or an aramid film and a copper foil are laminated by using the flame-retardant adhesive composition of the present invention. That is, the flexible copper-clad laminated board of the present invention is a material in which a polyimide film or an aramid film, an adhesive layer formed by the flame-retardant adhesive composition and a copper foil are disposed in this order. The adhesive layer and the copper foil may be formed onto the both surfaces of the polyimide film or aramid film. Since the flame-retardant adhesive composition of the present invention is excellent in adhesiveness with an article containing copper, the flexible copper-clad laminated board of the present invention is excellent in stability as an integrated material.

The constitution of the polyimide film or aramid film may be the same as that of the polyimide film or aramid film for the coverlay film of the present invention.

The adhesive layer is preferred that almost all the part of the flame-retardant adhesive composition is subjected to crosslinked reaction to form a cured product.

A thickness of the adhesive layer is generally in a range from 5 to 50 µm, and preferably from 10 to 40 µm.

The copper foil is not particularly limited, and an electrolytic copper foil, a rolled copper foil, or the like can be used.

Examples of the method for producing the flexible copper-clad laminated board of the present invention include a method in which a flame-retardant adhesive composition containing a carboxyl group-containing styrene-based elastomer (A), an epoxy resin (B), a phosphorus-containing oligomer (C) and a solvent is coated on a surface of a polyimide film, drying is conducted in the same manner as that for the coverlay film of the present invention, heat lamination is conducted at a temperature ranging from 80° C. to 150° C. while surface contacting a copper foil and a coating film surface of the film attached with the coated film, a resulting laminate (a polyimide film/an adhesive layer/a copper foil) is heated and pressed, and further the coated film is hardened by after cure. The heating and pressing may be conducted under conditions at a temperature ranging from 150° C. to 200° C., and a pressure of 1 to 3 MPa for 1 to 60 minutes. In addition, the after cure may be conducted under conditions at a temperature ranging from 100° C. to 200° C. for 30 minutes to 4 hours.

4. Bonding Sheet

The bonding sheet of the present invention is characterized in that an adhesive layer formed by using the flame-retardant adhesive composition of the present invention is formed onto a surface of a releasable film. The bonding sheet of the present invention may have an embodiment that the adhesive layer is provided between two sheets of the releasable films.

The releasable film may be used a conventionally known material such as a polyethylene terephthalate film, a polyethylene film, a polypropylene film, a silicone releasable treatment paper, a polyolefin resin-coated paper, a TPX film, and a fluorine-based resin film.

A thickness of the releasable film is generally in a range from 20 to 100 p.m. A thickness of the adhesive layer is generally in a range from 5 to 100 μm, and preferably from 10 to 60 μm.

Examples of the method for producing the bonding sheet of the present invention include a method in which a flame-retardant adhesive composition containing a carboxyl group-containing styrene-based elastomer (A), an epoxy resin (B), a phosphorus-containing oligomer (C) and a solvent is coated onto the surface of a releasable film, and drying is conducted in the same manner as that for the coverlay film of the present invention.

EXAMPLES

Hereinafter, the present invention is specifically described using Examples. The present invention is not limited to the Examples. In the following description, "part(s)" and "%" are based on mass.

1. Measurement Method and Evaluation Method
(1) Weight Average Molecular Weight

GPC measurement was carried out under the following conditions to obtain Mw of elastomers and phosphorus-containing oligomers. The Mw was calculated by converting the retention time measured by GPC based on the retention times of the standard polystyrenes.

Device: Allians 2695 (manufactured by Waters Corporation)
Column: Two TSK gel Super Multipore HZ-H and two TSK gel Super HZ2500
(manufactured by TOSOH CORPORATION)
Column temperature: 40° C.
Eluent: Tetrahydrofuran 0.35 ml/min
Detector: RI (2) Adhesive Peel Strength A polyimide film ("Kapton 100EN", tradename, available from DU PONT-TORAY CO., LTD.) having a thickness of 25 μm was prepared, and a liquid state adhesive composition was roll coated onto the surface thereof. Subsequently, the film attached with the coated film was stood still in an oven, and dried at a temperature of 100° C. for 3 minutes. A film (an adhesive layer) having a thickness of 25 μm was formed to obtain a coverlay film. Thereafter, a rolled copper foil with a thickness of 35 μm was superposed onto the surface of the adhesive layer of the coverlay film so that they were surface contacted, and laminated under conditions of a temperature of 120° C., a pressure of 0.2 MPa and a speed of 0.5 m/min. The laminated material (polyimide film/ adhesive layer/copper foil) was then subjected to heating and pressing under conditions of a temperature of 180° C. and a pressure of 3 MPa for 1 minute, thereafter, subjected to heating for curing at 180° C. for 1 hour to obtain a flexible copper-clad laminated board. The flexible copper-clad laminated board was cut to prepare adhesion test pieces with a predetermined size.

For evaluating adhesiveness, 180 degree adhesive peel strength (N/mm) when the polyimide film is peeled off from the adhesion test piece was measured under conditions of a temperature of 23° C. and a tensile speed of 50 mm/min according to JIS C 6481. A width of the adhesion test piece at the time of the measurement was made 10 mm.

(3) Resin Flowing-out Property

Punching was applied to the coverlay film and a hole with φ6 mm was formed. A rolled copper foil having a thickness of 35 μm was superposed onto a surface of the adhesive layer of the coverlay film so that they were surface contacted, and laminated under conditions of a temperature of 120° C., a pressure of 0.2 MPa and a speed of 0.5 m/min. Subsequently, the laminated material (polyimide film/adhesive layer/copper foil) was subjected to heating and pressing under conditions of a temperature of 180° C. and a pressure of 3 MPa for 1 minute. At this time, flowing-out of a resin component was occurred at a hole end of the polyimide hole portion of the integrally laminated material. A maximum flowing-out length from the hole end was measured. It was judged that smaller maximum flowing-out length is good, and larger is poor resin flowing-out property. This resin flowing-out property is to evaluate embedding property at the wiring portion of the FPC related products.

(4) Solder Heat Resistance

The following test was carried out by the conditions conforming to JIS C 6481. The adhesion test piece was cut to 20 mm square, and left under conditions at 23° C. and 55% RH for 24 hours. Thereafter, the test piece was floated on a solder bath while making the surface of the polyimide film upside at a predetermined temperature for 60 seconds, and a foamed state at the surface of the adhesion test piece was observed. At this time, an upper limit temperature at which no foam is observed to the adhesion test piece was made the temperature of the solder heat resistance.

(5) Insulation Reliability

To the coverlay film was laminated a copper-clad laminated board onto which a pattern of L/S=50/50 (a thickness of wiring; 50 μm, a distance between wirings; 50 μm) had been formed under conditions of a temperature of 120° C., a pressure of 0.2 MPa and a speed of 0.5 m/min. The laminated material of the polyimide film/adhesive layer/ copper-clad laminated board was then subjected to heating and pressing under conditions of a temperature 180° C. and a pressure of 3 MPa for 1 minute, thereafter, subjected to heating for curing at 180° C. for 1 hour to obtain a test piece.

A dedicated wire was connected to a terminal of the test piece, an insulation reliability test between wires was carried out under conditions of an applied voltage of 60V DC, a temperature of 120° C., a humidity of 90% and a testing time of 4 hours. After the test, appearance was observed. A case where no remarkable color change of the wiring or small degree of the same was judged as ○, and not a case was judged as x. A case where the insulation resistance value is higher than $1 \times 10^8 \Omega$ was judged as ○, and a case where it is lower than the same was judged as x.

(6) Flame Retardancy

A polyimide film ("Kapton 50EN", tradename, available from DU PONT-TORAY CO., LTD.) having a thickness of 12.5 μm was prepared, and a liquid state adhesive composition was roll coated onto the surface thereof. Subsequently, the film attached with the coated film was stood still in an oven, and dried at a temperature of 100° C. for 3 minutes. A film (an adhesive layer) having a thickness of 25 μm was formed to obtain a coverlay film. Thereafter, an aramid film ("MICTRON", tradename, available from TORAY INDUSTRIES, INC.) with a thickness of 4.4 μm was superposed onto the surface of the adhesive layer of the coverlay film so that they were surface contacted, and laminated under conditions of a temperature of 120° C., a pressure of 0.2 MPa and a speed of 0.5 m/min. The laminated material (polyimide film/adhesive layer/aramid film) was then subjected to heating and pressing under conditions of a temperature of 180° C. and a pressure of 3 MPa for 1 minute, thereafter, subjected to heating for curing at 180° C. for 1 hour to obtain a test piece for evaluating flame retardancy.

The test piece for evaluating flame retardancy was subjected to a thin material vertical burning test confirming to the UL94 standard, and the flame retardancy test passed (VTM-0) was judged as ○, and not passed was judged as x.

2. Raw Materials of Flame-retardant Adhesive Composition 2-1. Elastomer (1) Carboxyl Group-containing Styrene-based Elastomer a1

A maleic acid modified styrene-ethylene butylene-styrene block copolymer "Tuftec M1913" (tradename) available from Asahi Kasei Chemicals Corporation was used. A styrene/ethylene butylene ratio in this copolymer is 30/70. Mw is 150,000. An acid value is 10 mgKOH/g.

(2) Carboxyl Group-containing Styrene-based Elastomer a2

A maleic acid modified styrene-ethylene butylene-styrene block copolymer "Tuftec M1911" (tradename) available from Asahi Kasei Chemicals Corporation was used. A styrene/ethylene butylene ratio in this copolymer is 30/70. Mw is 150,000. An acid value is 2 mgKOH/g.

(3) Styrene-based Elastomer a3

A styrene-ethylene butylene-styrene block copolymer "Tuftec H1041" (tradename) available from Asahi Kasei Chemicals Corporation was used. A styrene/ethylene butylene ratio in this copolymer is 30/70. Mw is 150,000. An acid value is 0 mgKOH/g.

(4) Urethane-based Elastomer

"PANDEX T-5102" (tradename) available from DIC Corporation was used. There is no melting point of this elastomer, and an acid value thereof is 0.5 mg KOH/g.

(5) Acid Modified NBR-Based Elastomer

A carboxyl group-containing nitrile rubber "Nipol 1072J" (tradename) available from ZEON CORPORATION was used. A bonded acrylonitrile amount of this elastomer is 27% (a center value).

2-2. Epoxy Resin (1) Epoxy Resin b1

A dicyclopentadiene type polyfunctional epoxy resin "EPICLON HP-7200" (tradename) available from DIC Corporation was used. An epoxy equivalent of the epoxy resin b1 is 259 g/eq.

(2) Epoxy Resin b2

A naphthalene type polyfunctional epoxy resin "EPICLON HP-4700" (tradename) available from DIC Corporation was used. An epoxy equivalent of the epoxy resin b2 is 165 g/eq.

(3) Epoxy Resin b3

A bisphenol A type epoxy resin "Epikote jER828" (tradename) available from Mitsubishi Chemical Corporation was used. An epoxy equivalent of the epoxy resin b3 is 189 g/eq.

2-3. Flame Retardant (1) Flame Retardant c1

A phosphorus-containing oligomer "Nofia OL-1001" (tradename) available from FRX POLYMERS INC., was used. This phosphorus-containing oligomer is a compound represented by the general formula (2). Mw is 2,000 to 3,000. A phosphor content is 8.5%, and a glass transition temperature (Tg) is 83° C.

(2) Flame Retardant c2

A phosphorus-containing oligomer "Nofia OL-3001" (tradename) available from FRX POLYMERS INC., was used. This phosphorus-containing oligomer is a compound represented by the general formula (2). Mw is 3,500 to 4,500. A phosphor content is 10.0%, and a glass transition temperature (Tg) is 85° C.

(3) Flame Retardant x

A trisdiethyl phosphinate aluminum "EXOLIT OP-935" (tradename) available from CLARIANT K.K. was used. A phosphor content in the flame retardant x is 24%.

(4) Flame Retardant y

Aluminum hydroxide "HIGILITE 42M" (tradename) available from SHOWA DENKO K.K. was used.

2-4. Others (1) Curing Agent

A phenol novolac resin "PHENOLITE TD-2090" (tradename) available from DIC Corporation was used.

(2) Curing Accelerator

An imidazole-based curing accelerator "CUREZOL C11-Z" (tradename) available from SHIKOKU CHEMICALS CORPORATION was used.

(3) Solvent

A mixed solvent comprising toluene and methyl ethyl ketone (a mass ratio=90:10) was used.

3. Production of Flame-Retardant Adhesive Composition and Evaluation Thereof

Examples 1 to 6 and Comparative Examples 1 to 8

Into a 1,000 ml flask equipped with a stirring device were added the starting materials with a ratio as shown in Table 1 and Table 2. The mixture was stirred at room temperature for 6 hours to dissolve in the solvent to produce liquid state flame-retardant adhesive compositions. The obtained liquid state adhesive compositions were subjected to various kinds of evaluations. The results are shown in Tables 1 and 2.

TABLE 1

| | | Example | | | | | |
|---|---|---|---|---|---|---|---|
| | | 1 | 2 | 3 | 4 | 5 | 6 |
| Composition (parts by mass) | Carboxyl group-containing styrene-based elastomer a1 | 100 | 100 | 100 | 100 | 100 | |
| | Carboxyl group-containing styrene-based elastomer a2 | | | | | | 100 |
| | Epoxy resin b1 | 6 | 6 | | | 12 | 6 |
| | Epoxy resin b2 | | | 6 | | | |
| | Epoxy resin b3 | | | | 6 | | |
| | Flame retardant c1 | 14 | 32 | 14 | 14 | 15 | |
| | Flame retardant c2 | | | | | | 12 |
| | Curing accelerator | 0.2 | 0.2 | 0.2 | 0.2 | 0.4 | 0.2 |
| | Toluene | 360 | 360 | 360 | 360 | 360 | 360 |
| | Methyl ethyl ketone | 40 | 40 | 40 | 40 | 40 | 40 |
| Phosphor concentration (% by mass) | | 1.0 | 2.0 | 1.0 | 1.0 | 1.0 | 1.0 |

TABLE 1-continued

|  |  | Example | | | | | |
|---|---|---|---|---|---|---|---|
|  |  | 1 | 2 | 3 | 4 | 5 | 6 |
| Evaluation | Resin flowing-out property (mm) | 0.15 | 0.12 | 0.14 | 0.19 | 0.18 | 0.11 |
|  | Adhesive peel strength (N/mm) | 0.70 | 0.50 | 0.71 | 0.75 | 0.65 | 0.60 |
|  | Solder heat resistance (° C.) | 280 | 280 | 300 | 280 | 300 | 280 |
|  | Insulation reliability    Appearance | ○ | ○ | ○ | ○ | ○ | ○ |
|  | Insulation resistance value | ○ | ○ | ○ | ○ | ○ | ○ |
|  | Flame retardancy | ○ | ○ | ○ | ○ | ○ | ○ |

TABLE 2

|  |  | Comparative Example | | | | | | | |
|---|---|---|---|---|---|---|---|---|---|
|  |  | 1 | 2 | 3 | 4 | 5 | 6 | 7 | 8 |
| Composition (parts by mass) | Carboxyl group-containing styrene-based elastomer a1 |  | 100 | 100 | 100 | 100 | 100 |  |  |
|  | Carboxyl group-containing styrene-based elastomer a2 |  |  |  |  |  |  |  |  |
|  | Styrene-based elastomer a3 | 100 |  |  |  |  |  |  |  |
|  | Urethane-based elastomer |  |  |  |  |  |  | 100 |  |
|  | Acid modified NBR-based elastomer |  |  |  |  |  |  |  | 100 |
|  | Epoxy resin b1 | 6 | 6 | 30 |  | 6 | 6 |  |  |
|  | Epoxy resin b2 |  |  |  |  |  |  |  |  |
|  | Epoxy resin b3 |  |  |  |  |  |  | 6 | 6 |
|  | Flame retardant c1 | 14 | 7 | 17 | 13 |  |  | 14 | 14 |
|  | Flame retardant c2 |  |  |  |  |  |  |  |  |
|  | Flame retardant x |  |  |  |  | 5 |  |  |  |
|  | Flame retardant y |  |  |  |  |  | 100 |  |  |
|  | Curing agent |  |  |  |  |  |  | 8.6 |  |
|  | Curing accelerator | 0.2 | 0.2 | 1.0 | 0.2 | 0.2 | 0.2 | 0.2 | 0.2 |
|  | Toluene | 360 | 360 | 360 | 360 | 360 | 360 | 360 | 360 |
|  | Methyl ethyl ketone | 40 | 40 | 40 | 40 | 40 | 40 | 40 | 40 |
|  | Phosphor concentration (% by mass) | 1.0 | 0.5 | 1.0 | 1.0 | 1.0 | 0.0 | 1.0 | 1.0 |
| Evaluation | Resin flowing-out property (mm) | 0.55 | 0.19 | 0.62 | 0.02 | 0.12 | 0.01 | 0.09 | 0.08 |
|  | Adhesive peel strength (N/mm) | 0.41 | 0.97 | 0.15 | 0.55 | 0.66 | 0.12 | 0.88 | 0.79 |
|  | Solder heat resistance (° C.) | 220 | 300 | 280 | 220 | 260 | 240 | 220 | 260 |
|  | Insulation reliability    Appearance | x | ○ | x | ○ | x | ○ | x | x |
|  | Insulation resistance value | ○ | ○ | x | ○ | ○ | ○ | x | x |
|  | Flame retardancy | ○ | x | ○ | ○ | ○ | ○ | x | x |

From the results in Table 1, it can be understood that the flame-retardant adhesive compositions of Examples 1 to 6 are materials excellent in all the characteristics. On the other hand, Comparative example 1 uses the styrene-based elastomer having no carboxyl group, so that adhesiveness, heat resistance and insulation reliability are insufficient. Comparative example 2 is an example in which the content of the phosphorus-containing oligomer (C) is out of the range of the present invention, so that flame retardancy is not sufficient. Further, Comparative examples 3 and 4 are examples in which the content of the epoxy resin (B) are out of the range of the present invention, so that the effects of the present invention cannot be obtained. Comparative examples 5 and 6 which use flame retardants other than the phosphorus-containing oligomer (C) of the present invention are insufficient in insulation reliability, adhesiveness and heat resistance. Moreover, Comparative examples 7 and 8 which use elastomers other than the carboxyl group-containing styrene-based elastomer (A) of the present invention cannot obtain flame retardance even when the phosphorus-containing oligomer (C) of the present invention is used with predetermined amounts, and insulation reliability is also insufficient.

INDUSTRIAL APPLICABILITY

The flame-retardant adhesive composition of the present invention is excellent in adhesiveness to a polyimide film, or the like. When two parts are bonded, the adhered portion therebetween is excellent in heat resistance and insulation reliability, so that it is suitable for manufacturing related products of a flexible printed wiring circuit board such as a coverlay film, a flexible copper-clad laminated board, and a bonding sheet.

What is claimed is:
1. A flame-retardant adhesive composition comprising:
(A) a carboxyl group-containing styrene-based elastomer,
(B) an epoxy resin, and
(C) a phosphorus-containing oligomer comprising a structural unit represented by the following formula (1):

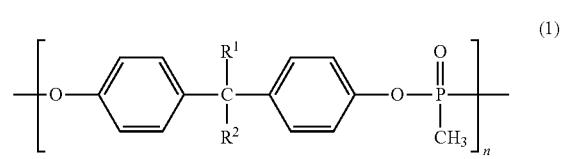

wherein R¹ and R² are each independently a hydrogen atom or a methyl group, and n is an integer of 1 to 20, wherein a content of the epoxy resin (B) is from 3 to 17 parts by mass, and a content of the phosphorus-containing oligomer (C) is from 10 to 50 parts by mass, based on 100 parts by mass of a content of the carboxyl group-containing styrene-based elastomer (A).

2. The flame-retardant adhesive composition according to claim 1, wherein an acid value of the carboxyl group-containing styrene-based elastomer (A) is from 0.1 to 20 mgKOH/g.

3. The flame-retardant adhesive composition according to claim 1, wherein a main chain chemical structure of the carboxyl group-containing styrene-based elastomer (A) is derived from at least one styrene-based elastomer selected from the group consisting of a styrene-butadiene block copolymer, a styrene-ethylene propylene block copolymer, a styrene-butadiene-styrene block copolymer, a styrene-isoprene-styrene block copolymer, a styrene-ethylene butylene-styrene block copolymer, and a styrene-ethylene propylene-styrene block copolymer.

4. The flame-retardant adhesive composition according to claim 1, wherein a weight-average molecular weight of the phosphorus-containing oligomer (C) is from 1000 to 10000.

5. The flame-retardant adhesive composition according to claim 1, wherein a phosphorus concentration in the flame-retardant adhesive composition is from 0.7% to 3% by mass, based on 100% by mass of a solid content of the flame-retardant adhesive composition.

6. The flame-retardant adhesive composition according to claim 5, wherein the phosphorus concentration in the flame-retardant adhesive composition is from 1% to 2% by mass, based on 100% by mass of the solid content of the flame-retardant adhesive composition.

7. A coverlay film comprising an adhesive layer comprising the flame-retardant adhesive composition according to claim 1, wherein the adhesive layer is formed on one surface of a polyimide film or an aramid film.

8. A flexible copper-clad laminated board, wherein a copper foil is laminated on one surface of a polyimide film or an aramid film with the flame-retardant adhesive composition according to claim 1.

9. A bonding sheet comprising an adhesive layer comprising the flame-retardant adhesive composition according to claim 1, wherein the adhesive layer is formed on one surface of a releasable film.

10. The flame-retardant adhesive composition according to claim 1, wherein the content of the phosphorus-containing oligomer (C) is from 10 to 40 parts by mass, based on 100 parts by mass of the content of the carboxyl group-containing styrene-based elastomer (A).

11. The flame-retardant adhesive composition according to claim 1, wherein the content of the phosphorus-containing oligomer (C) is from 12 to 32 parts by mass, based on 100 parts by mass of the content of the carboxyl group-containing styrene-based elastomer (A).

12. The flame-retardant adhesive composition according to claim 1, wherein the content of the phosphorus-containing oligomer (C) is from 14 to 32 parts by mass, based on 100 parts by mass of the content of the carboxyl group-containing styrene-based elastomer (A).

13. The flame-retardant adhesive composition according to claim 1, wherein an acid value of the carboxyl group-containing styrene-based elastomer (A) is from 0.5 to 18 mg KOH/g.

14. The flame-retardant adhesive composition according to claim 1, wherein an acid value of the carboxyl group-containing styrene-based elastomer (A) is from 1.0 to 15 mg KOH/g.

15. The flame-retardant adhesive composition according to claim 1, wherein a weight-average molecular weight of the phosphorus-containing oligomer (C) is from 1,200 to 8,000.

16. The flame-retardant adhesive composition according to claim 1, wherein a weight-average molecular weight of the phosphorus-containing oligomer (C) is from 1,500 to 5,000.

17. The flame-retardant adhesive composition according to claim 1 further comprising a curing agent, wherein a content of the curing agent is set so that a functional group equivalent of the curing agent is from 0.2 to 2.5, based on 1 epoxy equivalent of the epoxy resin (B).

18. The flame-retardant adhesive composition according to claim 1, further comprising a curing agent, wherein a content of the curing agent is set so that a functional group equivalent of the curing agent is from 0.4 to 2.0, based on 1 epoxy equivalent of the epoxy resin (B).

19. The flame-retardant adhesive composition of claim 1, wherein the content of the epoxy resin (B) is from 3 to 12 parts by mass, based on 100 parts by mass of the content of the carboxyl group-containing styrene-based elastomer (A).

* * * * *